(12) United States Patent
Farnham et al.

(10) Patent No.: US 7,022,457 B2
(45) Date of Patent: Apr. 4, 2006

(54) PHOTORESISTS WITH HYDROXYLATED, PHOTOACID-CLEAVABLE GROUPS

(75) Inventors: William Brown Farnham, Hockessin, DE (US); Andrew Edward Feiring, Wilmington, DE (US); Frank Leonard Schadt, III, Wilmington, DE (US); Weiming Qiu, Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 3 days.

(21) Appl. No.: 10/669,492

(22) Filed: Sep. 24, 2003

(65) Prior Publication Data
US 2004/0126697 A1    Jul. 1, 2004

Related U.S. Application Data

(60) Provisional application No. 60/415,855, filed on Oct. 3, 2002.

(51) Int. Cl.
G03C 1/73    (2006.01)
G03C 1/76    (2006.01)
G03F 7/038   (2006.01)
G03F 7/039   (2006.01)
G03F 7/30    (2006.01)

(52) U.S. Cl. ............... 430/270.1; 430/271.1; 430/272.1; 430/325; 430/326; 430/905; 430/907; 430/910; 430/914; 526/242; 526/247; 526/249; 526/250; 526/253; 526/254; 526/255; 526/280; 526/281; 526/320

(58) Field of Classification Search ............ 430/270.1, 430/905, 910, 907, 914, 280.1, 325, 326, 430/271.1, 272.1; 526/328.5, 329, 329.4, 526/250, 253, 254, 255, 247, 249, 242, 280, 526/281, 320
See application file for complete search history.

(56) References Cited

U.S. PATENT DOCUMENTS

| | | | |
|---|---|---|---|
| 5,945,267 A | * | 8/1999 | Yabuuchi ................ 430/544 |
| 6,280,897 B1 | | 8/2001 | Asakawa et al. |
| 6,596,458 B1 | * | 7/2003 | Sato et al. ............. 430/270.1 |
| 6,800,414 B1 | * | 10/2004 | Nishimura et al. ...... 430/270.1 |

* cited by examiner

*Primary Examiner*—Sin Lee

(57) ABSTRACT

The present invention pertains to photoimaging and the use of photoresists (positive-working and/or negative-working) for imaging in the production of semiconductor devices. The present invention also pertains to novel hydroxy ester-containing polymer compositions that are useful as base resins in resists and potentially in many other applications.

29 Claims, No Drawings

PHOTORESISTS WITH HYDROXYLATED, PHOTOACID-CLEAVABLE GROUPS

FIELD OF THE INVENTION

The present invention pertains to photoimaging and the use of photoresists (positive-working and/or negative-working) for imaging in the production of semiconductor devices. The present invention also pertains to novel hydroxy ester-containing polymer compositions that are useful as base resins in resists and potentially in many other applications.

BACKGROUND OF THE INVENTION

Polymers are used as components of imaging and photosensitive systems and particularly in photoimaging systems such as those described in *Introduction to Microlithography, Second Edition* by L. F. Thompson, C. G. Willson, and M. J. Bowden, American Chemical Society, Washington, D.C., 1994. In such systems, ultraviolet (UV) light or other electromagnetic radiation impinges on a material containing a photoactive component to induce a physical or chemical change in that material. A useful or latent image is thereby produced which can be processed into a useful image for semiconductor device fabrication.

Although the polymer itself may be photoactive, generally a photosensitive composition contains one or more photoactive components in addition to the polymer. Upon exposure to electromagnetic radiation (e.g., UV light), the photoactive component acts to change the rheological state, solubility, surface characteristics, refractive index, color, electromagnetic characteristics or other such physical or chemical characteristics of the photosensitive composition as described in the Thompson et al. publication supra.

For imaging very fine features at the submicron level in semiconductor devices, electromagnetic radiation in the far or extreme ultraviolet (UV) is needed. Positive working resists generally are utilized for semiconductor manufacture. Lithography in the UV at 365 nm (I-line) using novolak polymers and diazonaphthoquinones as dissolution inhibitors is a currently established chip technology having a resolution limit of about 0.35–0.30 micron. Lithography in the far UV at 248 nm using p-hydroxystyrene polymers is known and has a resolution limit of 0.35–0.18 micron. There is strong impetus for future photolithography at even shorter wavelengths, due to a decreasing lower resolution limit with decreasing wavelength (i.e., a resolution limit of 0.18–0.065 micron for 193 nm imaging). Photolithography using 193 nm exposure wavelength (obtained from an argon fluorine (ArF) excimer laser) is a leading candidate for future microelectronics fabrication using 0.18 and 0.13 micron design rules. Photolithography using 157 nm exposure wavelength (obtained using an $F_2$ laser source) may be used for future microelectronics fabrication using 0.100 micron or less design rules. The opacity of traditional near UV and far UV organic photoresists at 193 nm and shorter wavelengths precludes their use in single-layer schemes at these wavelengths.

There is a continuing need for photoresists with improved performance at 193 and 157 nm.

SUMMARY OF THE INVENTION

This invention relates to polymers and photoresists containing certain hydroxy ester functional group. In particular, this invention relates to a photoresist comprising a.) a polymer functionalized with at least one hydroxy ester functional group of the formula:

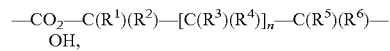

wherein
n=0, 1, 2, 3, 4 or 5;
$R^1$, $R^2=C_1-C_6$ alkyl, $C_1-C_6$ alkyl substituted with an ether oxygen; or $R^1$ and $R^2$ taken together form a 3- to 8-membered ring, optionally substituted with an ether oxygen, provided that the carbon attached to $R^1$ and $R^2$ is not at a bridgehead position;
$R^3$, $R^4$=H, $C_1-C_6$ alkyl, $C_1-C_6$ alkyl substituted with an ether oxygen; or $R^3$ and $R^4$ taken together form a 3- to 8-membered ring, optionally substituted with an ether oxygen;
$R^5$, $R^6$=H, $C_1-C_6$ alkyl, or $C_1-C_6$ alkyl substituted with an ether oxygen; or $R^5$ and $R^6$ taken together form a 3- to 8-membered ring, optionally substituted with an ether oxygen; or $R^1$ and $R^5$ taken together with $—[C(R^3)(R^4)]_n—$ form a 4- to 8-membered ring, provided that the carbon attached to $R^1$ and $R^2$ is not at a bridgehead position; and b.) a photoactive component.

This invention also relates to a photoresist comprising
a.) a polymer containing at least one repeat unit derived from

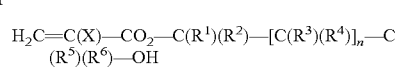

wherein X=H, $C_1-C_6$ alkyl, F, or F-substituted $C_1-C_6$ alkyl;
n=0, 1, 2, 3, 4 or 5;
$R^1$, $R^2=C_1-C_6$ alkyl, $C_1-C_6$ alkyl substituted with an ether oxygen; or $R^1$ and $R^2$ taken together form a 3- to 8-membered ring, optionally substituted with an ether oxygen, provided that the carbon attached to $R^1$ and $R^2$ is not at a bridgehead position;
$R^3$, $R^4$=H, $C_1-C_6$ alkyl, $C_1-C_6$ alkyl substituted with an ether oxygen; or $R^3$ and $R^4$ taken together form a 3- to 8-membered ring, optionally substituted with an ether oxygen;
$R^5$, $R^6$=H, $C_1-C_6$ alkyl, or $C_1-C_6$ alkyl substituted with an ether oxygen; or $R^5$ and $R^6$ taken together form a 3- to 8-membered ring, optionally substituted with an ether oxygen; or $R^1$ and $R^5$ taken together with $—[C(R^3)(R^4)]_n—$ form a 4- to 8-membered ring, provided that the carbon attached to $R^1$ and $R^2$ is not at a bridgehead position; and b.) a photoactive component.

This invention also relates to copolymers comprising
a.) a repeat unit containing at least one functional group of the formula:

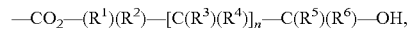

wherein
n=0, 1, 2, 3, 4 or 5;
$R^1$, $R^2=C_1-C_6$ alkyl, $C_1-C_6$ alkyl substituted with an ether oxygen; or $R^1$ and $R^2$ taken together form a 3- to 8-membered ring, optionally substituted with an ether oxygen, provided that the carbon attached to $R^1$ and $R^2$ is not at a bridgehead position;
$R^3$, $R^4$=H, $C_1-C_6$ alkyl, $C_1-C_6$ alkyl substituted with an ether oxygen; or $R^3$ and $R^4$ taken together form a 3- to 8-membered ring, optionally substituted with an ether oxygen;
$R^5$, $R^6$=H, $C_1-C_6$ alkyl, or $C_1-C_6$ alkyl substituted with an ether oxygen; or $R^5$ and $R^6$ taken together form a 3- to 8-membered ring, optionally substituted with an ether oxygen; or $R^1$ and $R^5$ taken together with $-[C(R^3)(R^4)]_n-$ form a 4- to 8-membered ring, provided that the carbon attached to $R^1$ and $R^2$ is not at a bridgehead position;

b.) a repeat unit derived from a polycyclic ethylenically unsaturated compound; and c.) a repeat unit derived from an ethylenically unsaturated compound which contains at least one fluorine atom covalently attached to an ethylenically unsaturated carbon atom.

This invention also relates to photoresists comprising a.) a polymer comprising i.) a repeat unit functionalized with at least one hydroxy ester group of the formula:

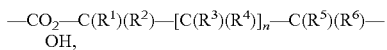

wherein n=0, 1, 2, 3, 4 or 5;

$R^1$, $R^2$=$C_1$–$C_6$ alkyl, $C_1$–$C_6$ alkyl substituted with an ether oxygen; or $R^1$ and $R^2$ taken together form a 3- to 8-membered ring, optionally substituted with an ether oxygen, provided that the carbon attached to $R^1$ and $R^2$ is not at a bridgehead position;

$R^3$, $R^4$=H, $C_1$–$C_6$ alkyl, $C_1$–$C_6$ alkyl substituted with an ether oxygen; or $R^3$ and $R^4$ taken together form a 3- to 8-membered ring, optionally substituted with an ether oxygen;

$R^5$, $R^6$=H, $C_1$–$C_6$ alkyl, or $C_1$–$C_6$ alkyl substituted with an ether oxygen; or $R^5$ and $R^6$ taken together form a 3- to 8-membered ring, optionally substituted with an ether oxygen; or $R^1$ and $R^5$ taken together with $-[C(R^3)(R^4)]_n-$ form a 4- to 8-membered ring, provided that the carbon attached to $R^1$ and $R^2$ is not at a bridgehead position;

ii.) a repeat unit derived from at least one polycyclic ethylenically unsaturated compound; and iii.) a repeat unit derived from at least one ethylenically unsaturated compound which contains at least one fluorine atom covalently attached to an ethylenically unsaturated carbon atom; and b.) a photoactive component.

In another embodiment, the invention is a process for preparing a photoresist image on a substrate comprising, in order: (W) coating a substrate with a photoresist composition, wherein the photoresist composition comprises:

a.) a polymer functionalized with at least one hydroxy ester functional group of the formula:

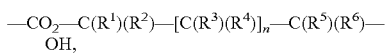

wherein n=0, 1, 2, 3, 4 or 5;

$R^1$, $R^2$=$C_1$–$C_6$ alkyl, $C_1$–$C_6$ alkyl substituted with an ether oxygen; or $R^1$ and $R^2$ taken together form a 3- to 8-membered ring, optionally substituted with an ether oxygen, provided that the carbon attached to $R^1$ and $R^2$ is not at a bridgehead position;

$R^3$, $R^4$=H, $C_1$–$C_6$ alkyl, $C_1$–$C_6$ alkyl substituted with an ether oxygen; or $R^3$ and $R^4$ taken together form a 3- to 8-membered ring, optionally substituted with an ether oxygen;

$R^5$, $R^6$=H, $C_1$–$C_6$ alkyl, or $C_1$–$C_6$ alkyl substituted with an ether oxygen; or $R^5$ and $R^6$ taken together form a 3- to 8-membered ring, optionally substituted with an ether oxygen; or $R^1$ and $R^5$ taken together with $-[C(R^3)(R^4)]_n-$ form a 4- to 8-membered ring, provided that the carbon attached to $R^1$ and $R^2$ is not at a bridgehead position;

b.) at least one photoactive component; and c.) a solvent;

(X) drying the coated photoresist composition to substantially remove the solvent and thereby to form a photoresist layer on the substrate;

(Y) imagewise exposing the photoresist layer to form imaged and non-imaged areas; and (Z) developing the exposed photoresist layer having imaged and non-imaged areas to form the relief image on the substrate.

This invention also relates to a coated substrate comprising a.) a substrate; and b.) a photoresist composition comprising i.) a polymer functionalized with at least one hydroxy ester functional group of the formula:

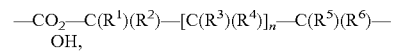

wherein n=0, 1, 2, 3, 4 or 5;

$R^1$, $R^2$=$C_1$–$C_6$ alkyl, $C_1$–$C_6$ alkyl substituted with an ether oxygen; or $R^1$ and $R^2$ taken together form a 3- to 8-membered ring, optionally substituted with an ether oxygen, provided that the carbon attached to $R^1$ and $R^2$ is not at a bridgehead position;

$R^3$, $R^4$=H, $C_1$–$C_6$ alkyl, $C_1$–$C_6$ alkyl substituted with an ether oxygen; or $R^3$ and $R^4$ taken together form a 3- to 8-membered ring, optionally substituted with an ether oxygen;

$R^5$, $R^6$=H, $C_1$–$C_6$ alkyl, or $C_1$–$C_6$ alkyl substituted with an ether oxygen; or $R^5$ and $R^6$ taken together form a 3- to 8-membered ring, optionally substituted with an ether oxygen; or $R^1$ and $R^5$ taken together with $-[C(R^3)(R^4)]_n-$ form a 4- to 8-membered ring, provided that the carbon attached to $R^1$ and $R^2$ is not at a bridgehead position; and ii.) a photoactive component.

The developing step (Z) can either be negative-working or positive-working.

The photoresist compositions of this invention have a particularly good balance of desirable properties, including high transparency to extreme, far, and near ultraviolet light, high plasma etch resistance, and projected high resolution characteristics suitable for microelectronics device fabrication using 0.18 and 0.13 μm and below design rules. The photoresist compositions of this invention in particular have good optical transparency at 193 and 157 nm. The novel copolymers of this invention also have good properties including anticipated high transparency at 193 and 157 nm and other wavelengths in the UV.

DETAILED DESCRIPTION OF THE PREFERRED EMBODIMENTS

The present invention provides polymers and copolymers that are functionalized with at least one hydroxy ester functional group that can serve as a protected acid group. The polymers and copolymers of the present invention are useful as photoresist components for use at 193 and 157 nm. Such protected acid groups can yield, by catalysis of acids or bases generated photolytically from photoactive compounds (PACs), hydrophilic acid groups which enable development of resist coatings, especially under aqueous conditions.

The hydroxy ester functional group of this invention has the formula

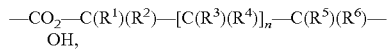
OH, wherein n=0, 1, 2, 3, 4 or 5;

$R^1$, $R^2$=$C_1$–$C_6$ alkyl, $C_1$–$C_6$ alkyl substituted with an ether oxygen; or $R^1$ and $R^2$ taken together form a 3- to 8-membered ring, optionally substituted with an ether oxygen, provided that the carbon attached to $R^1$ and $R^2$ is not at a bridgehead position;

$R^3$, $R^4$=H, $C_1$–$C_6$ alkyl, $C_1$–$C_6$ alkyl substituted with an ether oxygen; or $R^3$ and $R^4$ taken together form a 3- to 8-membered ring, optionally substituted with an ether oxygen;

$R^5$, $R^6$=H, $C_1$–$C_6$ alkyl, or $C_1$–$C_6$ alkyl substituted with an ether oxygen; or $R^5$ and $R^6$ taken together form a 3- to 8-membered ring, optionally substituted with an ether oxygen; or $R^1$ and $R^5$ taken together with —[C($R^3$)($R^4$)]$_n$— form a 4- to 8-membered ring, provided that the carbon attached to $R^1$ and $R^2$ is not at a bridgehead position.

In a preferred embodiment of this invention, $R^1$, $R^2$=$C_1$–$C_6$ alkyl, or $R^1$ and $R^2$ taken together form a 5- or 6-membered ring, provided that the carbon attached to $R^1$ and $R^2$ is not at a bridgehead position;

$R^3$, $R^4$=H, $C_1$–$C_6$ alkyl, or $R^3$ and $R^4$ taken together form a 5- or 6-membered ring;

$R^5$, $R^6$=H, $C_1$–$C_6$ alkyl, or $R^5$ and $R^6$ taken together form a 5- or 6-membered ring; and n=0, 1, 2 or 3.

The hydroxy ester functional group of the formula —$CO_2$—C($R^1$)($R^2$)—[C($R^3$)($R^4$)]$_n$—C($R^5$)($R^6$)—OH can be incorporated into polymers and copolymers by any of the several methods known to those skilled in the art. For example, acid-functionalized polymers can be reacted with a diol, HO—C($R^1$)($R^2$)—[C($R^3$)($R^4$)]$_n$—C($R^5$)($R^6$)—OH to give the corresponding ester.

Alternatively, the hydroxy ester functional group of the present invention can be incorporated into an ethylenically unsaturated compound that is either homopolymerized, or polymerized with other monomers, to form the desired hydroxy ester functionalized polymer. For example, the acrylate, $H_2C$=C(H)$CO_2$—C($R^1$)($R^2$)—[C($R^3$)($R^4$)]$_n$—C($R^5$)($R^6$)—OH, can be homopolymerized, or copolymerized with other acrylates, to form acrylate polymers, or copolymerized with other monomers, such as styrenics.

Suitable acrylate comonomers include acrylic acid, methyl acrylate, ethyl acrylate, propyl acrylate, tert-butyl acrylate, 2-methyl-2-adamantyl acrylate, 2-methyl-2-norbornyl acrylate, 2-methoxyethyl acrylate, 2-hydroxyethyl acrylate, 2-cyanoethyl acrylate, glycidyl acrylate, and 2,2,2-trifluoroethyl acrylate, as well as the corresponding methacrylate monomers. Such acrylate, as well as methacrylate, monomers can also be polymerized with other ethylenically unsaturated compounds such as fluoro-olefins and polycyclic olefins.

Suitable hydroxy esters include 2-propenoic acid, 2-hydroxy-1,1,2-trimethylpropyl ester (PinAc) and the analogous methacrylate monomer (PinMAc), and the monoacrylate and mono-methacrylate derivatives of 2,5-dimethyl-2,5-hexanediol. Suitable hydroxy esters can also be prepared from the products of the reductive dimerization of a wide variety of aliphatic and cycloaliphatic ketones, such a cyclohexanone, cyclopentanone and methyl ethyl ketone. Most preferably, the hydroxy ester is PinAc. In a preferred embodiment of this invention, the photoresist composition further comprises a repeat unit derived from at least one polycyclic ethylenically unsaturated compound. The ethylenically unsaturated group may be contained within the polycyclic moiety as in norbornene or may be pendant to the polycyclic moiety as in 1-adamantane carboxylate vinyl ester.

Suitable polycyclic ethylenically unsaturated compounds for use in this invention include, but are not limited to, the compounds shown below:

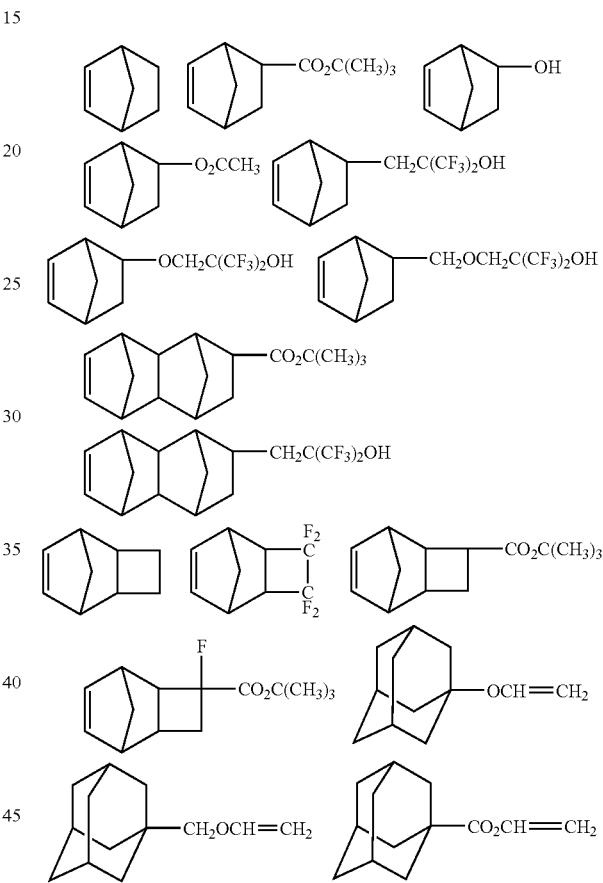

The photoresist and copolymers of this invention may also contain a repeat unit derived from at least one ethylenically unsaturated compound containing a fluoroalcohol, or a protected fluoroalcohol, which has fluoroalkyl groups present as part of the fluoroalcohol functional group. These fluoroalkyl groups are designated as $R_f$ and $R_f'$, which can be partially fluorinated alkyl groups or fully fluorinated alkyl groups (i.e., perfluoroalkyl groups). Broadly, $R_f$ and $R_f'$ are the same or different fluoroalkyl groups of from 1 to about 10 carbon atoms or taken together are $(CF_2)_n$ wherein n is 2 to 10. (In the last sentence, the terms "taken together" indicate that $R_f$ and $R_f'$ are not separate, discrete fluorinated alkyl groups, but that together they form a ring structure.)

$R_f$ and $R_f'$ can be partially fluorinated alkyl groups without limit, except that there must be a sufficient degree of fluorination present to impart acidity to the hydroxyl (—OH) of the fluoroalcohol functional group, such that the hydroxyl proton is substantially removed in basic media, such as in aqueous sodium hydroxide solution or tetraalkylammonium hydroxide solution. Preferably, there will be sufficient fluorine substitution present in the fluorinated alkyl groups of the fluoroalcohol functional group such that the hydroxyl group will have a pKa value of 5<pKa<11. Preferably, $R_f$ and $R_f'$ are independently perfluoroalkyl group of 1 to 5 carbon atoms, and, most preferably, $R_f$ and $R_f'$ are both trifluoromethyl ($CF_3$).

Suitable fluoroalcohol functional groups have the structure:

—$CH_2C(R_f)(R_f')OH$ wherein $R_f$ and $R_f'$ are the same or different fluoroalkyl groups of from 1 to about 10 carbon atoms, or taken together are $(CF_2)_n$ wherein n is 2 to 10.

Some illustrative, but nonlimiting, example of representative comonomers containing a fluoroalcohol functional group and within the scope of the invention are presented below:

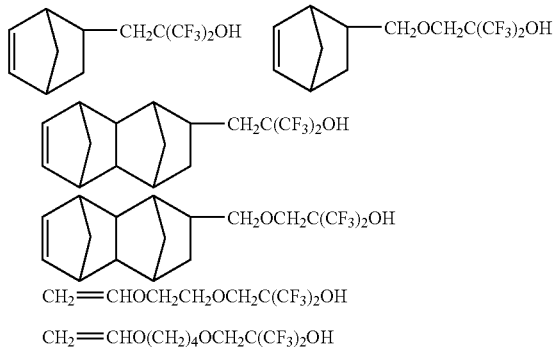

Some suitable comonomers containing the fluoroalcohol functionality are also polycyclic compounds.

In a preferred embodiment of this invention, the photoresist comprises a repeat unit derived from at least one ethylenically unsaturated compound containing at least one fluorine atom covalently attached to an ethylenically unsaturated carbon atom. Representative ethylenically unsaturated compounds that are suitable for this invention include, but are not limited to, tetrafluoroethylene, chlorotrifluoroethylene, hexafluoropropylene, trifluoroethylene, vinylidene fluoride, vinyl fluoride, perfluoro-(2,2-dimethyl-1,3-dioxole), perfluoro-(2-methylene-4-methyl-1,3-dioxolane, $CF_2=CFO(CF_2)_tCF=CF_2$, where t is 1 or 2, and $R_fOCF=CF_2$ wherein $R_f$ is a saturated fluoroalkyl group of from 1 to about 10 carbon atoms. Preferred comonomers are tetrafluoroethylene, chlorotrifluoroethylene, hexafluoropropylene, trifluoroethylene and $R_fOCF=CF_2$, wherein $R_f$ is a saturated fluoroalkyl group of from 1 to about 10 carbon atoms. More preferred are tetrafluoroethylene, chlorotrifluoroethylene, hexafluoropropylene, and $R_fOCF=CF_2$, wherein $R_f$ is a saturated perfluoroalkyl group of from 1 to about 10 carbon atoms.

In the sections that follow, the photoresist compositions of this invention are described in terms of their component parts.

Photoactive Component (PAC)

The photoresist compositions of this invention contain at least one photoactive component (PAC) that usually is a compound that affords either acid or base upon exposure to actinic radiation. If an acid is produced upon exposure to actinic radiation, the PAC is termed a photoacid generator (PAG). If a base is produced upon exposure to actinic radiation, the PAC is termed a photobase generator (PBG).

Suitable photoacid generators for this invention include, but are not limited to, 1) sulfonium salts (structure I), 2) iodonium salts (structure II), and 3) hydroxamic acid esters, such as structure III.

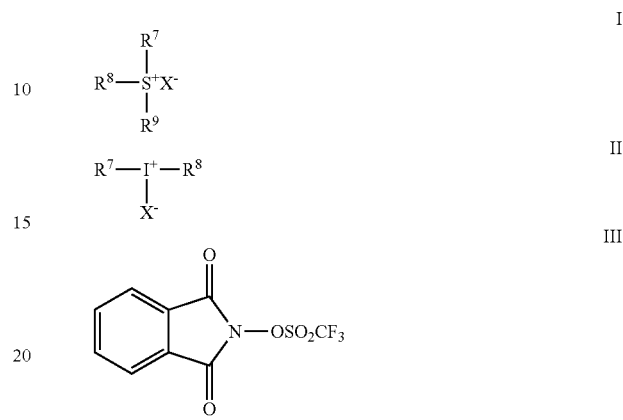

In structures I–II, $R^7$–$R^9$ are independently substituted or unsubstituted aryl or substituted or unsubstituted $C_1$–$C_{20}$ alkylaryl (aralkyl). Representative aryl groups include, but are not limited to, phenyl and naphthyl. Suitable substituents include, but are not limited to, hydroxyl (—OH) and $C_1$–$C_{20}$ alkyloxy (e.g., $C_{10}H_{21}O$). The anion X– in structures I–II can be, but is not limited to, $SbF_6$-(hexafluoroantimonate), $CF_3SO_3$—(trifluoromethylsulfonate=triflate), and $C_4F_9SO_3$—(perfluorobutylsulfonate).

Dissolution Inhibitors and Additives

Various dissolution inhibitors can be utilized in this invention. Ideally, dissolution inhibitors (DIs) for far and extreme UV resists (e.g., 193 nm resists) should be designed/chosen to satisfy multiple materials needs including dissolution inhibition, plasma etch resistance, and adhesion behavior of resist compositions comprising a given DI additive. Some dissolution inhibiting compounds also serve as plasticizers in resist compositions.

A variety of bile-salt esters (i.e., cholate esters) are particularly useful as DIs in the compositions of this invention. Bile-salt esters are known to be effective dissolution inhibitors for deep UV resists, beginning with work by Reichmanis et al. in 1983. (E. Reichmanis et al., "The Effect of Substituents on the Photosensitivity of 2-Nitrobenzyl Ester Deep UV Resists", J. Electrochem. Soc. 1983, 130, 1433–1437.) Bile-salt esters are particularly attractive choices as DIs for several reasons, including their availability from natural sources, their possessing a high alicyclic carbon content, and particularly for their being transparent in the deep and vacuum UV region, (which essentially is also the far and extreme UV region), of the electromagnetic spectrum (e.g., typically they are highly transparent at 193 nm). Furthermore, the bile-salt esters are also attractive DI choices since they may be designed to have widely ranging hydrophobic to hydrophilic compatibilities depending upon hydroxyl substitution and functionalization.

Representative bile-acids and bile-acid derivatives that are suitable as additives and/or dissolution inhibitors for this invention include, but are not limited to, those illustrated below, which are as follows: cholic acid (IV), deoxycholic acid (V), lithocholic acid (VI), t-butyl deoxycholate (VII), t-butyl lithocholate (VIII), and t-butyl-3-α-acetyl lithocholate (IX). Bile-acid esters, including compounds VII-IX, are preferred dissolution inhibitors in this invention.

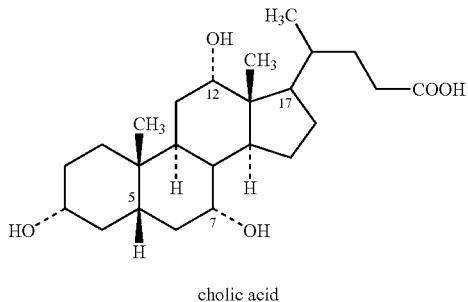

cholic acid

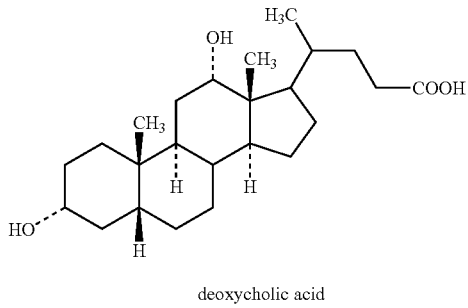

deoxycholic acid

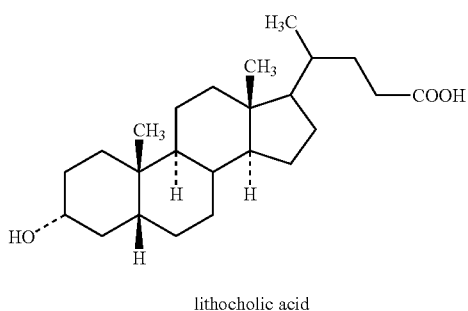

lithocholic acid

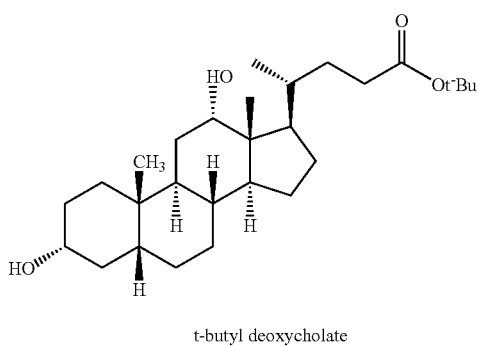

t-butyl deoxycholate

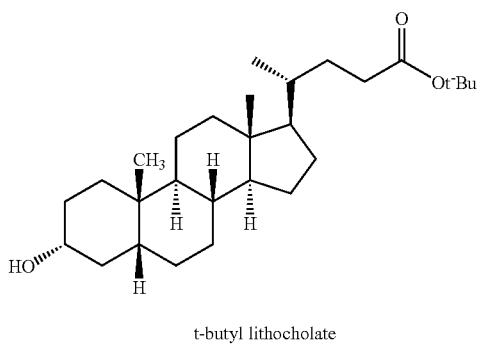

t-butyl lithocholate

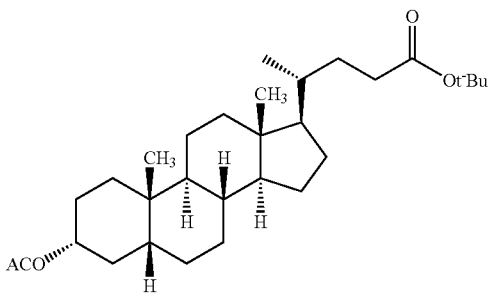

t-butyl-3α–acetyl lithocholate

Other types of dissolution inhibitors, such as various diazonaphthoquinones (DNQs) and diazocoumarins (DCs), can be utilized in this invention in some applications. Diazanaphthoquinones and diazocoumarins are generally suitable in resists compositions designed for imaging at higher wavelengths of UV light (e.g., 365 nm and perhaps at 248 nm). These dissolution inhibitors are generally not preferred in resist compositions designed for imaging with UV light at 193 nm or lower wavelengths, since these compounds absorb strongly in this region of the UV and are usually not sufficiently transparent for most applications at these low UV wavelengths.

Components for Negative-Working Photoresist Embodiment

Some embodiments of this invention are negative-working photoresists. These negative-working photoresists comprise at least one binder polymer comprised of acid-labile groups and at least one photoactive component that affords photogenerated acid. Imagewise exposure of the resist affords photogenerated acid which converts the acid-labile groups to polar functionality (e.g., conversion of ester functionality (less polar) to acid functionality (more polar)). Development is then done in an organic solvent or critical fluid (having moderate to low polarity), which results in a negative-working system in which exposed areas remain and unexposed areas are removed.

A variety of different crosslinking agents can be employed as required or optional photoactive component(s) in the negative-working compositions of this invention. (A crosslinking agent is required in embodiments that involve insolubilization in developer solution as a result of crosslinking, but is optional in preferred embodiments that involve insolubilization in developer solution as a result of polar groups being formed in exposed areas that are insoluble in organic solvents and critical fluids having moderate/low polarity). Suitable crosslinking agents include, but are not limited to, various bis-azides, such as 4,4'-diazidodiphenyl sulfide and 3,3'-diazidodiphenyl sulfone. Preferably, a negative-working resist composition containing a crosslinking agent(s) also contains suitable functionality (e.g., unsaturated C=C bonds) that can react with the reactive species (e.g., nitrenes) that are generated upon exposure to UV to produce crosslinked polymers that are not soluble, dispersed, or substantially swollen in developer solution, which consequently imparts negative-working characteristics to the composition.

Other Components

The compositions of this invention can contain optional additional components. Examples of additional components which can be added include, but are not limited to, resolution enhancers, adhesion promoters, residue reducers, coating aids, plasticizers, and $T_g$ (glass transition temperature) modifiers.

Process Steps

Imagewise Exposure

The photoresist compositions of this invention are sensitive in the ultraviolet region of the electromagnetic spectrum and especially to those wavelengths $\leq 365$ nm. Imagewise exposure of the resist compositions of this invention can be done at many different UV wavelengths including, but not limited to, 365 nm, 248 nm, 193 nm, 157 nm, and lower wavelengths. Imagewise exposure is preferably done with ultraviolet light of 248 nm, 193 nm, 157 nm, or lower wavelengths; is more preferably done with ultraviolet light of 193 nm, 157 nm, or lower wavelengths; and is still more preferably done with ultraviolet light of 157 nm or lower wavelengths. Imagewise exposure can either be done digitally with a laser or equivalent device or non-digitally with use of a photomask. Suitable laser devices for digital imaging of the compositions of this invention include, but are not limited to, an argon-fluorine excimer laser with UV output at 193 nm, a krypton-fluorine excimer laser with UV output at 248 nm, and a fluorine (F2) laser with output at 157 nm. Since, as discussed supra, use of UV light of lower wavelength for imagewise exposure corresponds to higher resolution (lower resolution limit), the use of a lower wavelength (e.g., 193 nm or 157 nm or lower) is generally preferred over use of a higher wavelength (e.g., 248 nm or higher).

Development

The resist compositions of this invention must contain sufficient functionality for development following imagewise exposure to UV light. Preferably, the functionality is acid or protected acid such that aqueous development is possible using a basic developer such as sodium hydroxide solution, potassium hydroxide solution, or ammonium or substituted ammonium hydroxide solution. The hydroxy ester group of this invention may function as the protected acid group. Some polymers in the resist compositions of this invention may further comprise at least one acid-containing or protected acid-containing monomer of structural unit:

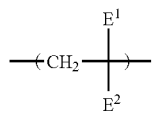

in which $E^1$ is H or $C_1$–$C_{12}$ alkyl, F or $CF_3$; $E^2$ is $CO_2E^3$, $SO_3E^3$, or other acidic functional group; and $E^3$ are H or $C_1$–$C_{12}$ alkyl, which is unsubstituted or hydroxyl-substituted. Alkyl groups can contain one to twelve carbon atoms and preferably one to eight. A preferred acid-containing binder polymer for aqueous processability (aqueous development) in use is a carboxylic acid-containing copolymer. The level of carboxylic acid groups is determined for a given composition by optimizing the amount needed for good development in aqueous alkaline developer.

A fluoro alcohol group, if present in the polymer, can contain a protecting group that protects the fluoro alcohol group from exhibiting its acidity while in this protected form. An alpha-alkoxyalkyl ether group is a preferred protecting group for the fluoro alcohol in order to maintain a high degree of transparency in the photoresist composition. The resulting protected fluoroalcohol group has the structure:

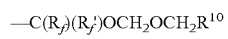

In this protected fluoroalcohol, $R_f$ and $R_f'$ are as described above and $R^{10}$ is hydrogen or a linear or branched alkyl group of 1 to 10 carbon atoms. An illustrative, but non-limiting, example of an alpha-alkoxyalkyl ether group is methoxy methyl ether. A fluoro alcohol with this protecting group can be obtained by reaction of the fluoroalcohol with chloromethylmethyl ether.

When an aqueous processable photoresist is coated or otherwise applied to a substrate and imagewise exposed to UV light, development of the photoresist composition may require that the binder material should contain sufficient acid groups (e.g., carboxylic acid groups) and/or protected acid groups that are at least partially deprotected upon exposure to render the photoresist (or other photoimageable coating composition) processable in aqueous alkaline developer. In case of a positive-working photoresist layer, the photoresist layer will be removed during development in portions which are exposed to UV radiation but will be substantially unaffected in unexposed portions during development by aqueous alkaline liquids such as wholly aqueous solutions containing 0.262 N tetramethylammonium hydroxide (with development at 25° C. usually for less than or equal to 120 seconds) or 1% sodium carbonate by weight (with development at a temperature of 30° C. usually for less than or equal to 2 minutes). In case of a negative-working photoresist layer, the photoresist layer will be removed during development in portions which are unexposed to UV radiation but will be substantially unaffected in exposed portions during development using a critical fluid, an organic solvent, or an aqueous alkaline solution.

A critical fluid, as used herein, is one or more substances heated to a temperature near or above its critical temperature and compressed to a pressure near or above its critical pressure. Critical fluids in this invention are at least at a temperature that is higher than 15° C. below the critical temperature of the fluid and are at least at a pressure higher than 5 atmospheres below the critical pressure of the fluid. Carbon dioxide may be used for the critical fluid in the present invention, including use as a developer. Various organic solvents can also be used as developer in this invention. These include, but are not limited to, halogenated solvents and non-halogenated solvents. Halogenated solvents are preferred and fluorinated solvents are more preferred.

Substrates

The substrates employed in this invention include silicon, silicon oxide, silicon nitride, silicon oxynitride, and various other materials used in semiconductor manufacture.

| GLOSSARY | |
|---|---|
| Analytical/Measurements | |
| bs | broad singlet |
| δ | NMR chemical shift measured in the indicated solvent |
| g | gram |
| NMR | Nuclear Magnetic Resonance |
| $^1$H NMR | Proton NMR |
| $^{13}$C NMR | Carbon-13 NMR |
| $^{19}$F NMR | Fluorine-19 NMR |
| s | singlet |
| sec. | second(s) |
| m | multiplet |
| mL | milliliter(s) |
| mm | millimeter(s) |
| $T_g$ | Glass Transition Temperature |
| $M_n$ | Number-average molecular weight of a given polymer |
| $M_w$ | Weight-average molecular weight of a given polymer |
| $P = M_w/M_n$ | Polydispersity of a given polymer |
| Absorption coefficient | AC = A/b, where A, absorbance, = $Log_{10}(1/T)$ and b = film thickness in microns, where T = transmittance as defined below. |
| Transmittance | Transmittance, T, = ratio of the radiant power transmitted by a sample to the radiant power incident on the sample and is measured for a specified wavelength λ(e.g., nm). |
| Chemicals/Monomers | |
| MAdA | 2-Methyl-2-adamantyl acrylate (2-Propenoic acid, 2-methyltricyclo[3.3.1.13,7]dec-2-yl ester) [CAS Reg number 249562-06-9] OHKA America, Inc., Milpitas, CA |
| MEK | 2-Butanone Aldrich Chemical Co., Milwaukee, WI |
| Perkadox ® 16 N | Di-(4-tert-butylcyclohexyl)peroxydicarbonate Noury Chemical Corp., Burt, NY |
| PGMEA | Propylene glycol methyl ether acetate Aldrich Chemical Co., Milwaukee, WI |
| PinAc | 2-Propenoic acid, 2-hydroxy-1,1,2-trimethylpropyl ester [CAS Reg number 97325-36-5] |
| Solkane 365 mfc | 1,1,1,3,3-Pentafluorobutane Solvay Fluor, Hannover, Germany |
| t-BuAc | tert-Butyl acrylate Aldrich Chemical Company, Milwaukee, WI |
| TCB | Trichlorobenzene Aldrich Chemical Co., Milwaukee, WI |
| TFE | Tetrafluoroethylene E. I. du Pont de Nemours and Company, Wilmington, DE |
| THF | Tetrahydrofuran |
| NB—Me—OH | X=OH |
| NB—Me—F—OH | X=OCH$_2$C(CF$_3$)$_2$OH |
| NB—Me—F—OMOM | X=OCH$_2$C(CF$_3$)$_2$OCH$_2$OCH$_3$ |

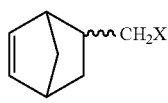

| NB—OAc | X=OCOCH$_3$ |
|---|---|
| NB—OH | X=OH |
| NB—F—OH | X=OCH$_2$C(CF$_3$)$_2$OH |
| NB—F—OMOM | X=OCH$_2$C(CF$_3$)$_2$OCH$_2$OCH$_3$ |

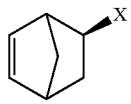

| VE—F—OH | CH$_2$=CHOCH$_2$CH$_2$OCH$_2$C(CF$_3$)$_2$OH |
|---|---|
| VE—F—OMOM | CH$_2$=CHOCH$_2$CH$_2$OCH$_2$C(CF$_3$)$_2$OCH$_2$OCH$_3$ |

NB-OAc and NB-OH were prepared as described by Posner et al. *Tetrahedron*, vol. 32, page 2281 (1976) and Davies et al. *J. Chem. Soc.* Perkin I, page 433 (1973). NB-F-OH, NB-F-OMOM, NB-Me-F-OH and NB-Me-F-OMOM were prepared as described by Feiring and Feldman, PCT Int. Appl. WO 2000067072 (Nov. 9, 2000).

| Ultraviolet | |
| --- | --- |
| Extreme UV | Region of the electromagnetic spectrum in the ultraviolet that ranges from 10 nanometers to 200 nanometers |
| Far UV | Region of the electromagnetic spectrum in the ultraviolet that ranges from 200 nanometers to 300 nanometers |
| UV | Ultraviolet region of the electromagnetic spectrum which ranges from 10 nanometers to 390 nanometers |
| Near UV | Region of the electromagnetic spectrum in the ultraviolet that ranges from 300 nanometers to 390 nanometers |

EXAMPLES

Unless otherwise specified, all temperatures are in degrees Celsius, all mass measurements are in grams, and all percentages are weight percentages.

Unless otherwise indicated, n, appearing within structure(s) given in the examples, represents the number of repeat units in the polymer. Throughout the specification, p, appearing within structure(s), represents the number of repeat units in the polymer.

Glass transition temperatures ($T_g$) were determined by DSC (differential scanning calorimetry) using a heating rate of 20° C./min, data is reported from the second heat. The DSC unit used is a Model DSC2910 made by TA Instruments, Wilmington, Del.

The term "clearing dose" indicates the minimum exposure energy density (e.g., in units of $mJ/cm^2$) to enable a given photoresist film, following exposure, to undergo development.

Example 1

Synthesis of PinAc from Pinacol and Acryloyl Chloride

A 3 neck round bottom flask fitted with overhead stirrer, dropping funnel, reflux condenser, nitrogen atmosphere, and thermowell, was charged with pinacol (23.6 g, 0.20 mol), ether (150 mL), and triethylamine (10.6 g, 0.105 mol; freshly distilled). Acryloyl chloride (9.05 g, 0.10 mol) was added dropwise at room temperature (22°–27° C.), adjusting the addition rate to accommodate the exotherm. The mixture was stirred at room temperature for 18 hr.

The mixture was added to cold water (100 mL) and the entire resulting mixture was filtered. The organic phase was washed with additional water (50 mL), dried ($Na_2SO_4$, $MgSO_4$), and stripped to give 5.8 g of yellow oil. Kugelrohr distillation provided two fractions, 3.44 g, bp 35–45° C./0.05 mm; ca. 1.0 g, bp 60–80° C./0.5 mm.

NMR ($C_6D_6$) of crude yellow oil is consistent with a ca. 2/1 mixture of desired ester/residual diol, contaminated with ca. 6 mol % of the bis-acrylate.

Residual pinacol was removed by washing with water.

Example 2

Synthesis of PinAc from Pinacol and Acryloyl Chloride

A 3 neck round bottom flask fitted with overhead stirrer, dropping funnel, and thermowell, and nitrogen atmosphere was charged with pinacol (47.2 g, 0.40 mol) and ethylene glycol dimethyl ether (175 mL). The solution was cooled to −15° C. and treated dropwise with a solution of methyl lithium in ether (125 mL, 1.6 M, 0.20 mol). When addition was complete, the mixture was warmed to 0° C. and stirred for 10 minutes. The mixture was cooled to −20° C. and treated dropwise over 0.5 hr with acryloyl chloride (19.0 g, 0.21 mol). After a 15 minute hold time at −20° C., a mixture of 0.5 g phenothiazine, 0.5 g monomethylhydroquinone and 0.1 g TEMPO was added. The mixture was then treated dropwise with water (4 mL), warmed to 0° C., and stirred for 15 min before work-up.

The mixture was filtered ($N_2$ pressure) to remove solids. The solid was washed with additional ether (75 mL) which was combined with the first filtrate. Another portion of 0.5 g phenothiazine and 0.5 g monomethylhydroquinone and 0.1 g TEMPO was added to the filtrate. Evaporation provided 28.4 g of thick yellow oil which was kugelrohr distilled to give 17.3 g of colorless oil, bp 45–55° C./0.2 mm. $^1H$ NMR showed ca. 92% monoadduct, ca. 8% bis (acrylate). Kugelrohr distilled material combined from two runs was subjected to spinning band distillation to provide 17.1 g of pure product, bp 40–42° C./0.05 mm.

Example 3

Polymer of TFE, NB-F-OH and PinAc

A metal pressure vessel of approximate 270 mL capacity was charged with 71.05 g NB-F-OH, 0.8 g PinAc and 25 mL Solkane 365 mfc. The vessel was closed, cooled to about −15° C. and pressured to 400 psi with nitrogen and vented several times. The reactor contents were heated to 50° C. TFE was added to a pressure of 340 psi and a pressure regulator was set to maintain the pressure at 340 psi throughout the polymerization by adding TFE as required. A solution of 82.57 g of NB-F-OH and 9.58 g of PinAc diluted to 100 mL with Solkane 365 mfc was pumped into the reactor at a rate of 0.10 mL/minute for 12 hr. Simultaneously with the monomer feed solution, a solution of 7.3 g Perkadox® 16N and 60 mL methyl acetate diluted to 100 mL with Solkane 365 mfc was pumped into the reactor at a rate of 2.0 mL/minute for 6 minutes, and then at a rate of 0.1 mL/minute for 8 hours. After 16 hours of reaction time, the vessel was cooled to room temperature and vented to 1 atmosphere. The recovered polymer solution was added slowly to an excess of hexane while stirring. The precipitate was filtered, washed with hexane and air dried. The resulting solid was dissolved in a mixture of THF and Solkane 365 mfc and added slowly to excess to hexane. The precipitate was filtered, washed with hexane and dried in a vacuum oven overnight to give 57.4 g of white polymer. From its $^{13}C$ NMR spectrum, the polymer composition was found to be 39% TFE, 47% NB-F-OH and 14% PinAc. DSC: Tg=135° C. GPC: Mn=4800; Mw=8400; Mw/Mn=1.77. Anal. Found: C, 44.86; H, 3.85; F, 38.27.

Example 4

Polymer of TFE, NB-F-OH and PinAc

A metal pressure vessel of approximate 270 mL capacity was charged with 69.6 g NB-F-OH, 1.72 g PinAc and 25 mL Solkane 365 mfc. The vessel was closed, cooled to about −15° C. and pressured to 400 psi with nitrogen and vented several times. The reactor contents were heated to 50° C. TFE was added to a pressure of 320 psi and a pressure regulator was set to maintain the pressure at 320 psi throughout the polymerization by adding TFE as required. A solution of 78.54 g of NB-F-OH and 13.14 g of PinAc diluted to 100 mL with Solkane 365 mfc was pumped into the reactor at a rate of 0.10 mL/minute for 12 hr. Simultaneously with the monomer feed solution, a solution of 7.3 g Perkadox® 16N and 60 mL methyl acetate diluted to 100 mL with Solkane 365 mfc was pumped into the reactor at a rate of 2.0 mL/minute for 6 minutes, and then at a rate of 0.1 mL/minute for 8 hours. After 16 hours of reaction time, the vessel was cooled to room temperature and vented to 1 atmosphere. The recovered polymer solution was added slowly to an excess of hexane while stirring. The precipitate was filtered, washed with hexane and air dried. The resulting solid was dissolved in a mixture of THF and Solkane 365 mfc and added slowly to excess to hexane. The precipitate was filtered, washed with hexane and dried in a vacuum oven overnight to give 51.6 g of white polymer. DSC: Tg=143 ° C. GPC: Mn =6200; Mw=9900; Mw/Mn=1.59. Anal. Found: C, 46.77; H, 4.56; F, 33.94.

Example 5

Polymer of TFE, NB-F-OH, t-BuAc and PinAc

A metal pressure vessel of approximate 270 mL capacity was charged with 71.05 g NB-F-OH, 0.48 g t-BuAc, 0.22 g PinAc and 25 mL Solkane 365 mfc. The vessel was closed, cooled to about −15° C. and pressured to 400 psi with nitrogen and vented several times. The reactor contents were heated to 50° C. TFE was added to a pressure of 340 psi and a pressure regulator was set to maintain the pressure at 340 psi throughout the polymerization by adding TFE as required. A solution of 82.57 g of NB-F-OH, 5.33 g t-BuAc and 3.58 g of PinAc diluted to 100 mL with Solkane 365 mfc was pumped into the reactor at a rate of 0.10 mL/minute for 12 hr. Simultaneously with the monomer feed solution, a solution of 7.3 g Perkadox® 16N and 60 mL methyl acetate diluted to 100 mL with Solkane 365 mfc was pumped into the reactor at a rate of 2.0 mL/minute for 6 minutes, and then at a rate of 0.1 mL/minute for 8 hours. After 16 hours of reaction time, the vessel was cooled to room temperature and vented to 1 atmosphere. The recovered polymer solution was added slowly to an excess of heptane while stirring. The precipitate was filtered, washed with heptane and air dried. The resulting solid was dissolved in a mixture of THF and Solkane 365 mfc and added slowly to excess to heptane. The precipitate was filtered, washed with heptane and dried in a vacuum oven overnight to give 45.3 g of white polymer. From its $^{13}$C NMR spectrum, the polymer composition was found to be 34% TFE, 45% NB-F-OH, 12% t-BuAc and 8% PinAc. DSC: Tg=141° C. GPC: Mn=6800; Mw=10100; Mw/Mn=1.49. Anal. Found: C, 46.14; H, 4.43; F, 36.91.

Example 6

Polymer of TFE, NB-F-OH, MAdA and PinAc

A metal pressure vessel of approximate 270 mL capacity was charged with 71.05 g NB-F-OH, 0.72 g MAdA, 0.30 g PinAc and 50 mL Solkane 365 mfc. The vessel was closed, cooled to about −15° C. and pressured to 400 psi with nitrogen and vented several times. The reactor contents were heated to 50° C. TFE was added to a pressure of 325 psi and a pressure regulator was set to maintain the pressure at 325 psi throughout the polymerization by adding TFE as required. A solution of 85.59 g of NB-F-OH, 7.64 g MAdA and 3.00 g of PinAc diluted to 100 mL with Solkane 365 mfc was pumped into the reactor at a rate of 0.10 mL/minute for 12 hr. Simultaneously with the monomer feed solution, a solution of 7.3 g Perkadox® 16N and 60 mL methyl acetate diluted to 100 mL with Solkane 365 mfc was pumped into the reactor at a rate of 2.0 mL/minute for 6 minutes, and then at a rate of 0.1 mL/minute for 8 hours. After 16 hours of reaction time, the vessel was cooled to room temperature and vented to 1 atmosphere. The recovered polymer solution was added slowly to an excess of hexane while stirring. The precipitate was filtered, washed with hexane and air dried. The resulting solid was dissolved in a mixture of THF and Solkane 365 mfc and added slowly to excess to hexane. The precipitate was filtered, washed with hexane and dried in a vacuum oven overnight to give 45.6 g of white polymer. From its $^{13}$C NMR spectrum, the polymer composition was found to be 37% TFE, 49% NB-F-OH, 11% MAdA and 3% PinAc. DSC: Tg=158° C. GPC: Mn=5300; Mw=9300; Mw/Mn=1.76. Anal. Found: C, 45.56; H, 4.07; F, 38.82.

Example 7

Polymer of TFE, NB-F-OH, MAdA and PinAc

A metal pressure vessel of approximate 270 mL capacity was charged with 71.05 g NB-F-OH, 0.39 g MAdA, 0.56 g PinAc and 50 mL Solkane 365 mfc. The vessel was closed, cooled to about −15° C. and pressured to 400 psi with nitrogen and vented several times. The reactor contents were heated to 50° C. TFE was added to a pressure of 325 psi and a pressure regulator was set to maintain the pressure at 325 psi throughout the polymerization by adding TFE as required. A solution of 85.59 g of NB-F-OH, 3.82 g MAdA and 5.97 g of PinAc diluted to 100 mL with Solkane 365 mfc was pumped into the reactor at a rate of 0.10 mL/minute for 12 hr. Simultaneously with the monomer feed solution, a solution of 7.3 g Perkadox® 16N and 60 mL methyl acetate diluted to 100 mL with Solkane 365 mfc was pumped into the reactor at a rate of 2.0 mL/minute for 6 minutes, and then at a rate of 0.1 mL/minute for 8 hours. After 16 hours of reaction time, the vessel was cooled to room temperature and vented to 1 atmosphere. The recovered polymer solution was added slowly to an excess of heptane while stirring. The precipitate was filtered, washed with heptane and air dried. The resulting solid was dissolved in a mixture of THF and Solkane 365 mfc and added slowly to excess to heptane. The precipitate was filtered, washed with heptane and dried in a vacuum oven overnight to give 50.5 g of white polymer. From its $^{13}$C NMR spectrum, the polymer composition was found to be 36% TFE, 46% NB-F-OH, 4% MAdA and 12% PinAc. DSC: Tg=127° C. (very faint transition). GPC: Mn=4900; Mw=8900; Mw/Mn=1.84. Anal. Found: C, 45.36; H, 4.03; F, 38.04.

Example 8

Polymer of TFE, NB-F-OH, MAdA and PinAc

A metal pressure vessel of approximate 270 mL capacity was charged with 78.3 g NB-F-OH, 3.96 g MAdA, 2.06 g PinAc, 7.2 g tetrahydrofuran chain transfer agent and 35 mL Solkane 365 mfc. The vessel was closed, cooled to about −15° C. and pressured to 400 psi with nitrogen and vented several times. The reactor contents were heated to 50° C. TFE was added to a pressure of 270 psi and a pressure regulator was set to maintain the pressure at 270 psi throughout the polymerization by adding TFE as required. A solution of 58.0 g of NB-F-OH, 28.6 g MAdA and 14.91 g of PinAc diluted to 100 mL with Solkane 365 mfc was pumped into the reactor at a rate of 0.10 mL/minute for 12 hr.

Simultaneously with the monomer feed solution, a solution of 7.3 g Perkadox® 16N and 60 mL methyl acetate diluted to 100 mL with Solkane 365 mfc was pumped into the reactor at a rate of 2.0 mL/minute for 6 minutes, and then at a rate of 0.1 mL/minute for 8 hours. After 16 hours of reaction time, the vessel was cooled to room temperature and vented to 1 atmosphere. The recovered polymer solution was added slowly to an excess of hexane while stirring. The precipitate was filtered, washed with hexane and air dried. The resulting solid was dissolved in a mixture of THF and Solkane 365 mfc and added slowly to excess to hexane. The precipitate was filtered, washed with hexane and dried in a vacuum oven overnight to give 62.6 g of white polymer. DSC: Tg=157° C. GPC: Mn=6700; Mw=12900; Mw/Mn=1.84. Anal. Found: C, 56.04; H, 6.33; F, 22.91.

Example 9

Polymer of TFE, NB-F-OH, MAdA and PinAc

A metal pressure vessel of approximate 270 mL capacity was charged with 78.3 g NB-F-OH, 5.28 g MAdA, 1.03 g PinAc, 7.2 g tetrahydrofuran chain transfer agent and 35 mL Solkane 365 mfc. The vessel was closed, cooled to about −15° C. and pressured to 400 psi with nitrogen and vented several times. The reactor contents were heated to 50° C. TFE was added to a pressure of 270 psi and a pressure regulator was set to maintain the pressure at 270 psi throughout the polymerization by adding TFE as required. A solution of 58.0 g of NB-F-OH, 38.13 g MAdA and 7.45 g of PinAc diluted to 100 mL with Solkane 365 mfc was pumped into the reactor at a rate of 0.10 mL/minute for 12 hr. Simultaneously with the monomer feed solution, a solution of 7.3 g Perkadox® 16N and 60 mL methyl acetate diluted to 100 mL with Solkane 365 mfc was pumped into the reactor at a rate of 2.0 mL/minute for 6 minutes, and then at a rate of 0.1 mL/minute for 8 hours. After 16 hours of reaction time, the vessel was cooled to room temperature and vented to 1 atmosphere. The recovered polymer solution was added slowly to an excess of hexane while stirring. The precipitate was filtered, washed with hexane and air dried. The resulting solid was dissolved in a mixture of THF and Solkane 365 mfc and added slowly to excess to hexane. The precipitate was filtered, washed with hexane and dried in a vacuum oven overnight to give 54.6 g of white polymer. DSC: Tg=175° C. GPC: Mn=7900; Mw=14300; Mw/Mn=1.82. Anal. Found: C, 58.07; H, 6.20; F, 21.94.

Example 10

Formulation and Imaging of Polymer of TFE, NB-F-OH, and PinAc

The following solution was prepared, magnetically stirred overnight, and filtered through a 0.45 μm PTFE syringe filter before use:

| Component | Wt. (gm) |
|---|---|
| TFE/NB—F—OH/PinAc polymer from Example 5 | 1.938 |
| 2-Heptanone | 12.356 |
| Solution prepared by diluting, 1/1 with 2-heptanone, a 1.0% (wt) solution of tetrabutylammonium hydroxide in ethyl lactate | 1.21 |

-continued

| Component | Wt. (gm) |
|---|---|
| 6.82% (wt) solution of triphenylsulfonium nonaflate dissolved in heptanone which had been filtered through a 0.45 μm PTFE syringe filter. | 1.496 |

All imaging exposures were made using an Exitech 157 nm microstepper. Resist formulations were spin-coated on 8 inch Si wafers which were first vapor primed at 90° C. with hexamethyidisilazane (HMDS). The resulting films were soft baked, or post-apply baked (PAB), at 150° C. for 60 sec, and then their thicknesses were measured using a Prometrix interferometer which utilized Cauchy coefficients determined by variable angle spectroscopic ellipsometry measurements using a J. A. Woollam VU301 variable angle spectroscopic ellipsometer. After open frame exposure on the Exitech stepper (typically 100 exposure doses were made), or imaging using either a binary mask with numerical aperture (N.A.)=0.6 and partial coherence (σ)=0.7, or a Levenson strong phase shift mask with N.A.=0.6 and σ=0.3, the wafer was post-exposure baked (PEB) at 110° C. for 60 sec followed by a 60 sec puddle develop with Shipley LDD-26W 2.38% tetramethyl ammonium hydroxide. The open frame exposed wafers were then subjected to thickness measurements on the Prometrix interferometer in order to determine the thickness loss versus exposure dose, and the imaged wafers were examined using a JEOL 7550 top-down and tilt scanning electron microscope (SEM), and in some cases cross-sections were made and examined using a Hitachi 4500 SEM.

This resist formulation was spin cast on an 8 inch Si wafer at a speed of 2032 rpm, yielding a film of measured thickness 2152 Å after PAB at 150° C. for 60 sec. This film was then exposed to 157 nm radiation in the Exitech stepper using a phase shift mask to yield a latent image. After exposure the film was PEB at 110° C. for 60 sec, and then puddle developed at 60 sec at room temperature using Shipley LDD-26W developer. The resulting image was examined using a JEOL 7550 SEM. At an exposure dose of 55 mJ/cm$^2$ the image was found to exhibit dense and isolated features at 100 nm resolution.

Example 11

Formulation and Imaging of Polymer of TFE, NB-F-OH, t-BuAc, and PinAc

The following solution was prepared, magnetically stirred overnight, and filtered through a 0.45 μm PTFE syringe filter before use:

| Component | Wt. (gm) |
|---|---|
| TFE/NB—F—OH/tBA/PinAc polymer from Example 6 | 1.368 |
| 2-Heptanone | 8.726 |
| Solution prepared by diluting, 1/1 with 2-heptanone, a 1.0% (wt) solution of tetrabutylammonium hydroxide in ethyl lactate | 0.850 |
| 6.82% (wt) solution of triphenylsulfonium nonaflate dissolved in heptanone which had been filtered through a 0.45 μm PTFE syringe filter. | 1.056 |

The general imaging procedure in Example 10 was used, except that the PEB was 130° C. This resist formulation was spin cast on an 8 inch Si wafer at a speed of 2032 rpm, yielding a film of measured thickness 2152 Å after PAB at 150° C. for 60 sec. This film was then exposed to 157 nm radiation in the Exitech stepper using a phase shift mask to yield a latent image. After exposure the film was PEB at 130° C. for 60 sec, and then puddle developed at 60 sec at room temperature using Shipley LDD-26W developer. The resulting image was examined using a JEOL 7550 SEM. At an exposure dose of 42 mJ/cm² the image was found to exhibit dense and isolated features at 100 nm resolution.

Example 12

Formulation and Imaging of Polymer of TFE, NB-F-OH, MAdA, and PinAc

A solution was prepared as in Example 10, except that the polymer used was the TFE/NB-F-OH/MAdA/PinAc polymer from Example 6.

The general imaging procedure in Example 11 was used, except that the PEB was 105° C. This resist formulation was spin cast on an 8 inch Si wafer, yielding a film of measured thickness 2158 Å after PAB at 150° C. for 60 sec. This film was then exposed to 157 nm radiation in the Exitech stepper using a phase shift mask to yield a latent image. After exposure the film was PEB at 105° C. for 60 sec, and then puddle developed at 60 sec at room temperature using Shipley LDD-26W developer. The resulting image was examined using a JEOL 7550 SEM. At an exposure dose of 74 mJ/cm² the image was found to exhibit 100 nm dense and 60 nm isolated features.

Example 13

Formulation and Imaging of Polymer of TFE, NB-F-OH, MAdA, and PinAc

A solution was prepared as in Example 11, except that the polymer used was the TFE/NB-F-OH/MAdA/PinAc polymer from Example 7.

The general imaging procedure in Example 11 was used, except that the PEB was 10° C. This resist formulation was spin cast on an 8 inch Si wafer, yielding a film of measured thickness 2158 Å after PAB at 150° C. for 60 sec. This film was then exposed to 157 nm radiation in the Exitech stepper using a phase shift mask to yield a latent image. After exposure the film was PEB at 105° C. for 60 sec, and then puddle developed at 60 sec at room temperature using Shipley LDD-26W developer. The resulting image was examined using a JEOL 7550 SEM. At an exposure dose of 74 mJ/cm2 the image was found to exhibit 100 nm dense and 60 nm isolated features.

Example 14

Formulation and Imaging of Polymer of TFE, NB-F-OH, MAdA, and PinAc

The following solution was prepared, magnetically stirred overnight, and filtered through a 0.45 μm PTFE syringe filter before use:

| Component | Wt. (gm) |
|---|---|
| TFE/NB—F—OH/MAdA/PinAc polymer from Example 9 | 0.869 |
| 2-Heptanone | 5.822 |
| Solution prepared by diluting, 1/1 with 2-heptanone, a 1.0% (wt) solution of tetrabutylammonium hydroxide in ethyl lactate | 0.360 |
| 6.82% (wt) solution of triphenylsulfonium nonaflate dissolved in heptanone which had been filtered through a 0.45 μm PTFE syringe filter. | 0.449 |

The general imaging procedure in Example 11 was used, except that the PEB was 120° C. This resist formulation was spin cast on an 8 inch Si wafer at a speed of 1918 rpm, yielding a film of measured thickness 2145 Å after PAB at 150° C. for 60 sec. This film was then exposed to 157 nm radiation in the Exitech stepper using a phase shift mask to yield a latent image. After exposure the film was PEB at 120° C. for 60 sec, and then puddle developed at 60 sec at room temperature using Shipley LDD-26W developer. The resulting image was examined using a JEOL 7550 SEM. At an exposure dose of 58 mJ/cm² the image was found to exhibit 100 nm dense and 50 nm isolated features.

While the invention has been particularly shown and described with reference to preferred embodiments thereof, it will be understood by those skilled in the art that various changes in form and details may be made without departing from the spirit and scope of the invention as defined in the appended claims.

What is claimed is:

1. A photoresist comprising
   a.) a polymer functionalized with at least one hydroxy ester functional group of the formula:

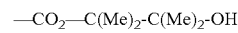
   —CO$_2$—C(Me)$_2$-C(Me)$_2$-OH and
   b.) a photoactive component.

2. The photoresist of claim 1, wherein said polymer further comprises a fluoroalcohol group or a protected fluoroalcohol group.

3. The photoresist of claim 2, wherein the fluoroalcohol group or protected fluoroalcohol group is derived from at least one ethytenically unsaturated compound containing a fluoroalcohol group having the structure, —C(R$_f$)(R$_f'$)OH, wherein R$_f$ and R$_f'$ are the same or different fluoroalkyl groups of from 1 to about 10 carbon atoms, or taken together are (CF$_2$)$_n$, wherein n is 2 to 10.

4. The photoresist of claim 3, wherein R$_f$ and R$_f'$ are CF$_3$.

5. A photoresist comprising
   a.) a polymer comprising at least one repeat unit derived from

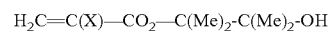
   H$_2$C=C(X)—CO$_2$—C(Me)$_2$-C(Me)$_2$-OH wherein X=H, C$_1$–C$_6$ alkyl, F, or F-substituted C$_1$–C$_6$ alkyl; and
   b.) a photoactive component.

6. The photoresist of claim 5, wherein said polymer further comprises a repeat unit derived from an etylenically unsaturated compound which contains at least one fluorine atom covalently attached to an ethylenically unsaturated carbon atom.

7. The photoresist of claim 6, wherein the ethylenically unsaturated compound is selected from the group consisting of tetrafluoroethylene, chlorotrifluoroethylene, hexafluoropropylene, trifluoroethylene, vinylidene fluoride, vinyl fluoride, perfluoro-(2,2-dimethyl-1,3-dioxole), perfluoro-(2-methylene-4-methyl-1,3-dioxolane, $CF_2=CFO(CF_2)_tCF=CF_2$, where t is 1 or 2, and $R_fOCF=CE_2$, wherein $R_f$ is a saturated fluoroalkyl group of from 1 to about 10 carbon atoms.

8. The photoresist of claim 5, wherein said polymer further comprises a repeat unit derived from a polycyclic ethylenically unsaturated compound.

9. The photoresist of claim 8, wherein the polycyclic ethylenically unsaturated compound is selected from the group consisting of

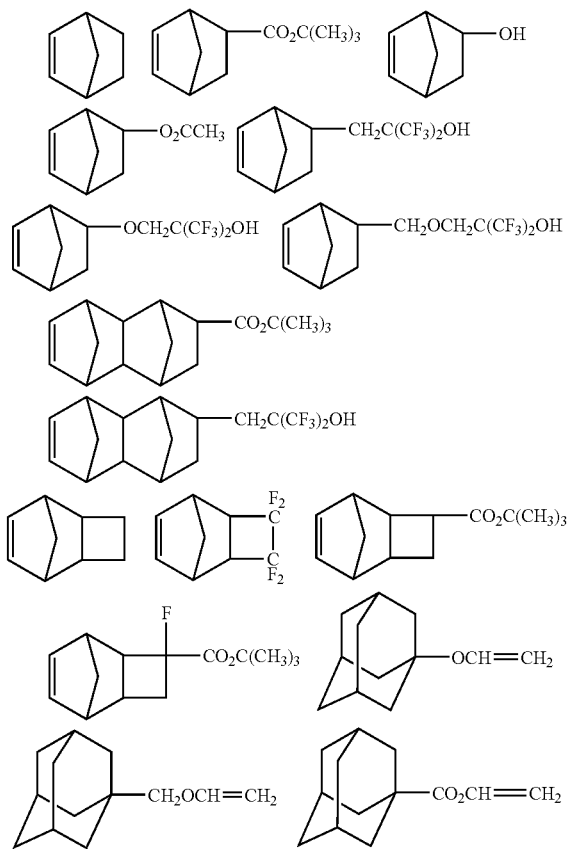

10. The photoresist of claim 5, wherein said polymer further comprises a repeat unit derived from monomers selected from the group consisting of acrylic acid, methyl acrylate, ethyl acrylate, propyl acrylate, tert-butyl acrylate, 2-methyl-2-adamantyl acrylate, 2-methyl-2-norbornyl acrylate, 2-methoxyethyl acrylate, 2-hydroxyethyl acrylate, 2-cyanoethyl acrylate, glycidyl acrylate, and 2,2,2-trifluoroethyl acrylate, and the corresponding methacrylate monomers.

11. The photoresist of claim 10, wherein the monomer is selected from the group of tert-butyl acrylate and 2-methyl-2-adamantyl acrylate.

12. The photoresist of claim 5, wherein said polymer further comprises a repeat unit derived from NB-F-OH.

13. A copolymer comprising
a.) a repeat unit containing at least one hydroxy ester functional group of the formula:

—$CO_2$—$C(R^1)(R^2)$—$[C(R^3)(R^4)]_n$—$C(R^5)(R^6)$—
OH, wherein
n=0, 1, 2, 3, 4 or 5;
$R^1$, $R^2=C_1-C_6$ alkyl, $C_1-C_6$ alkyl substituted with an ether oxygen; or $R^1$ and $R^2$ taken together form a 3- to 8-membered ring, optionally substituted with an ether oxygen, provided that the carbon attached to $R^1$ and $R^2$ is not at a bridgehead position;
$R^3$, $R^4=$H, $C_1-C_6$ alkyl, $C_1-C_6$ alkyl substituted with an ether oxygen; or $R^3$ and $R^4$ taken together fonn a 3- to 8-inembered ring, optionally substituted with an ether oxygen;
$R^5$, $R^6=$H, $C_1-C_6$ alkyl, or $C_1-C_6$ alkyl substituted wit an ether oxygen; or $R^5$ and $R^6$ taken together form a 3- to 8-membered ring, optionally substituted with an ether oxygen; or $R^1$ and $R^5$ taken together with —$[C(R^3)(R^4)]_n$—form a 4- to 8-membered ring, provided that the carbon attached to $R^1$ and $R^2$ is not at a bridgehead position;
b.) a repeat unit derived from a polycyclic ethylenically unsaturated compound; and
c.) a repeat unit derived from an ethylenically unsaturated compound selected from the group consisting of tetrafluoroethylene, chlorotrifluoroethylene, hexafluoropropylene, trifluoroethylene, vinylidene fluoride, vinyl fluoride, perfluoro-(2,2-dimethyl-1,3-dioxole), perfluoro-(2-methylene-4-methyl-1,3-dioxolane, $CF_2=CFO(CF_2)_tCF=CF_2$, where t is 1 or 2, and $R_f'OCF=CF_2$, wherein $R_f'$ is a saturated fluoroalkyl group of from 1 to about 10 carbon atoms.

14. The copolymer of claim 13, wherein the ethylenically unsaturated compound is tetrafluoroethylene.

15. The copolymer of claim 13, wherein the polycyclic ethylenically unsaturated compound is selected from the group consisting of

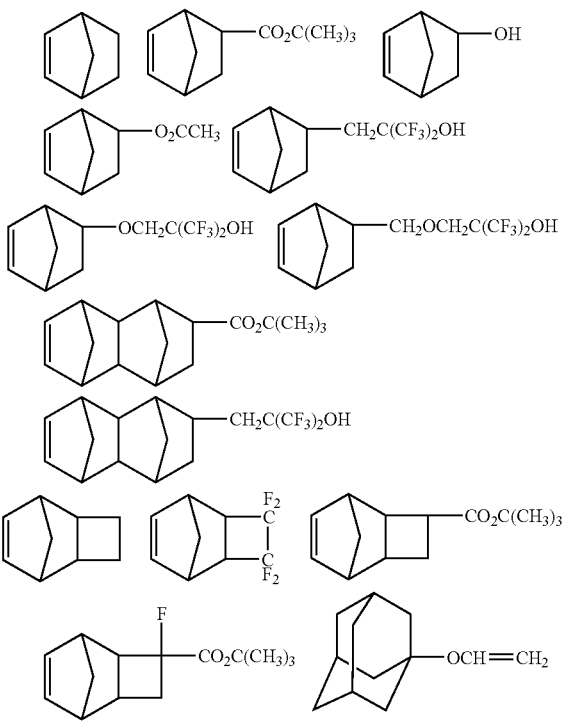

-continued

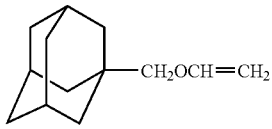 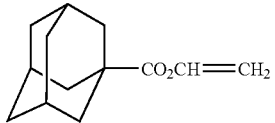

16. A photoresist comprising
a.) a polymer comprising
   i) a repeat unit fimetionalized with at least one hydroxy ester functional group of the formula:

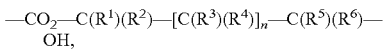

wherein
   n=0, 1, 2, 3, 4 or 5;
   $R^1, R^2 = C_1-C_6$ alkyl, $C_1-C_6$ alkyl substituted with an ether oxygen; or $R^1$ and $R^2$ taken together form a 3- to 8-membered ring, optionally substituted with an ether oxygen, provided that the carbon attached to $R^1$ and $R^2$ is not at a bridgehead position;
   $R^3, R^4 = H, C_1-C_6$ alkyl, $C_1-C_6$ alkyl substituted with an ether oxygen; or $R^3$ and $R^4$ taken together form a 3- to 8-membered ring, optionally substituted with an ether oxygen;
   $R^5, R^6 = H, C_1-C_6$ alkyl, or $C_1-C_6$ alkyl substituted with an ether oxygen; or $R^5$ and $R^6$ taken together form a 3- to 8-membered ring, optionally substituted with an ether oxygen; or $R^1$ and $R^5$ taken together with $-[C(R^3)(R^4)]_n-$ form a 4- to 8-membered ring, provided that the carbon attached to $R^1$ and $R^2$ is not at a bridgehead position;
   ii.) a repeat unit derived front at least one polycyclic ethylenically unsaturated compound; and
   iii.) a repeat unit derived from at least one ethylenically unsaturated compound selected from the group consisting of tetrafluoroethylene, chlorotrifluoroethylene, hexafluoropropylene, trifluoroethylene, vinylidene fluoride, vinyl fluoride, perfluoro-(2,2-dimethyl-1,3-dioxole), perfluoro-(2-methylene-4-methyl-1,3-dioxolane, $CF_2=CFO(CF_2)_tCF=CF_2$, where t is 1 or 2, and $R_f'OCF=CF_2$, wherein $R_f'$ is a saturated fluoroalkyl group of from 1 to about 10 carbon atoms; and
b.) a photoactive component 17. The photoresist composition of claim 16, wherein the photoactive component is a photoacid generator.

18. The photoresist composition of claim 16, further comprising a dissolution inhibitor.

19. The photoresist composition of claim 16, further comprising a solvent.

20. The photoresist composition of claim 19, wherein the solvent is chosen from the group consisting of ether esters, ketones, esters, glycol ethers, unsubstituted and substituted hydrocarbons, aromatic hydrocarbons, fluorinated solvents and supereritical $CO_2$.

21. The photoresist composition of claim 16, further comprising at least one additive selected from the group consisting of bases, surfactants, resolution enhancers, adhesion promoters, residue reducers, coating aids, plasticizers, and $T_g$ (glass transition temperature) modifiers.

22. A copolymner comprising
a.) a first repeat unit containing at least one hydroxy ester functional aroup of the formula:

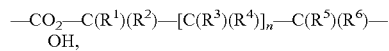

wherein
n=0, 1, 2, 3, 4 or 5;
$R^1, R^2 = C_1-C_6$ alkyl, $C_{1-C_6}$ alkyl substituted with an ether oxygen; or $R^1$ and $R^2$ taken together form a 3- to 8-membered ring, optionally substituted with an ether oxygen, provided that the carbon attached to $R^1$ and $R^2$ is not at a bridgehead position;
$R^3, R^4 = H, C_1-C_6$ alkyl, $C_1-C_6$ alykl substituted with an ether oxygen; or $R^3$ and $R^4$ taken together form a 3- to 8-membered ring, optionally substituted with an ether oxygen;
$R^5, R^6 = H, C_1-C_6$ alkyl, or $C_1-C_6$ alkyl substituted with an ether oxygen; or $R^5$ and $R^6$ taken together form a 3- to 8-membered ring, optionally substituted with an ether oxygen; or
$R^1$ and $R^5$ taken together with $-[C(R^3)(R^4)]_n-$ form a 4- to 8-membered ring, provided that the carbon attached to $R^1$ and $R^2$ is not at a bridgehead position;
b.) a second repeat unit derived from a polycyclic ethylenically unsaturated compound wherein the ethylenically unsaturated groups contained within the polycyclic moiety; and
c.) a third repeat unit derived from an ethylenically unsaturated compound which contains at least one fluorine atom covalently attached to an ethylenically unsaturated carbon atom.

23. A photoresist comprising
a.) a polymer comprising
   i) a first repeat unit functionalized with at least one hydroxy ester functional group of the formula:

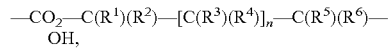

wherein
   n=0, 1, 2, 3, 4 or 5;
   $R^1, R^2 = C_1-C_6$ alkyl, $C_1-C_6$ alkyl substituted with an ether oxygen; or $R^1$ and $R^2$ taken together form a 3- to 8-membered ring, optionally substituted with an ether oxygen, provided that the carbon attached to $R^1$ and $R^2$ is not at a bridgehead position;
   $R^3, R^4 = H, C_1-C_6$ alky, $C_1-C_6$ alkyl substituted with an ether oxygen; or $R^3$ and $R^4$ taken together form a 3- to 8-membered membered ring, optionally substituted with an ether oxygen;
   $R^5, R^6 = H, C_1-C_6$ alkyl, or $C_1-C_6$ alkyl substituted with an ether oxygen; or $R^5$ and $R^6$ taken together form a 3- to 8-membered ring, optionally substituted with an ether oxygen; or $R^1$ and $R^5$ taken together with $-[C(R^3)(R^4)]_n-$ form a 4- to 8-membered ring, provided that the carbon attached to $R^1$ and $R^2$ is not at a bridgehead position;
   ii.) a second repeat unit derived from at least one polycyclic ethylenically unsaturated compound wherein the ethylenically unsaturated group is contained within the polycyclic moiety; and
   iii.) a third repeat unit derived from at least one ethylenically unsaturated compound which contains at least one fluorine atom covalently attached to an ethylenically unsaturated carbon atom; and
b.) a photoactive component.

24. A photoresist comprising
a.) a polymer comprising:
   1. at least one hydroxy ester functional group of the formula:

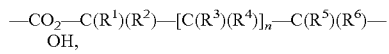

wherein n=0, 1, 2, 3, 4 or 5;

$R^1$, $R^2 = C_1–C_6$ alkyl, $C_1–C_6$ alkyl substituted with an ether oxygen; or $R^1$ and $R^2$ taken together form a 3- to 8-membered ring, optionally substituted with an ether oxygen, provided that the carbon attached to $R^1$ and $R^2$ is not at a bridgehead position;

$R^3$, $R^4 = H$, $C_1–C_6$ alky, $C_1–C_6$ alkyl substituted with an ether oxygen; or $R^3$ and $R^4$ taken together form a 3- to 8-membered ring, optionally substituted with an ether oxygen;

$R^5$, $R^6 = H$, $C_1–C_6$ alkyl, or $C_1–C_6$ alkyl substituted with an ether oxygen; or $R^5$ and $R^6$ taken together form a 3- to 8-membered ring, optionally substituted with an ether oxygen; or $R^1$ and $R^5$ taken together with $-[C(R^3)(R^4)]_n-$ form a 4- to 8-membered ring, provided that the carbon attached to $R^1$ and $R^2$ is not at a bridgehead position;

2.) a repeat unit derived from NB-F-OH; and b.) a photoactive component.

25. A photoresist comprising a.) a polymer comprising at least one repeat unit derived from

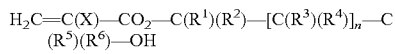

wherein $X = H$, $C_1–C_6$ alkyl, F, or F-substituted $C_1–C_6$ alkyl;

n=0, 1, 2, 3, 4 or 5;

$R^1$, $R^2 = C_1–C_6$ alkyl, $C_1–C_6$ alkyl substituted with an ether oxygen; or $R^1$ and $R^2$ taken together form a 3- to 8-membered ring, optionally substituted with an ether oxygen, provided that the carbon attached to $R^1$ and $R^2$ is not at a bridgehead position;

$R^3$, $R^4 = H$, $C_1–C_6$ alky, $C_1–C_6$ alkyl substituted with an ether oxygen; or $R^3$ and $R^4$ taken together form a 3- to 8-membered ring, optionally substituted with an ether oxygen;

$R^5$, $R^6 = H$, $C_1–C_6$ alkyl, or $C_1–C_6$ alkyl substituted with an ether oxygen; or $R^5$ and $R^6$ taken together form a 3- to 8-membered ring, optionally substituted with an ether oxygen; or $R^1$ and $R^5$ taken together with $-[C(R^3)(R^4)]_n-$ form a 4- to 8-membered ring, provided that the carbon attached to $R^1$ and $R^2$ is not at a bridgehead position;

b.) a repeat unit derived from NB-F-OH; and c.) a photoactive component.

26. A coated substrate comprising a.) a substrate; and b.) a photoresist of claim 1, 5, 16, 23, 24, or 25.

27. The coated substrate of claim 26, wherein the substrate is selected from the group consisting of silicon, silicon oxide, silicon oxynitride, and silicon nitride.

28. A copolymer comprising a.) a repeat unit containing at least one hydroxy ester functional group of the formula:

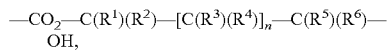

wherein n=0, 1, 2, 3 or 5;

$R^1$, $R^2 = C_1–C_6$ alkyl, $C_1–C_6$ alkyl substituted with an ether oxygen; or $R^1$ and $R^2$ taken together form a 3- to 8-membered ring, optionally substituted with an ether oxygen, provided that the carbon attached to $R^1$ and $R^2$ is not at a bridgehead position;

$R^3$, $R^4 = H$, $C_1–C_6$ alky, $C_1–C_6$ alkyl substituted with an ether oxygen; or $R^3$ and $R^4$ taken together form a 3- to 8-membered ring, optionally substituted with an ether oxygen, $R^5$, $R^6 = H$, $C_1–C_6$ alkyl, or $C_1–C_6$ alkyl substituted with an ether oxygen; or $R^5$ and $R^6$ taken together form a 3- to 8-membered ring, optionally substituted with an ether oxygen; or $R^1$ and $R^5$ taken together with $-[C(R^3)(R^4)]_n-$ form a 4- to 8-membered ring, provided that the carbon attached to $R^1$ and $R^2$ is not at a bridgehead position;

b.) a repeat unit derived from a polycyclic ethylenically unsaturated compound which is selected from the group consisting of

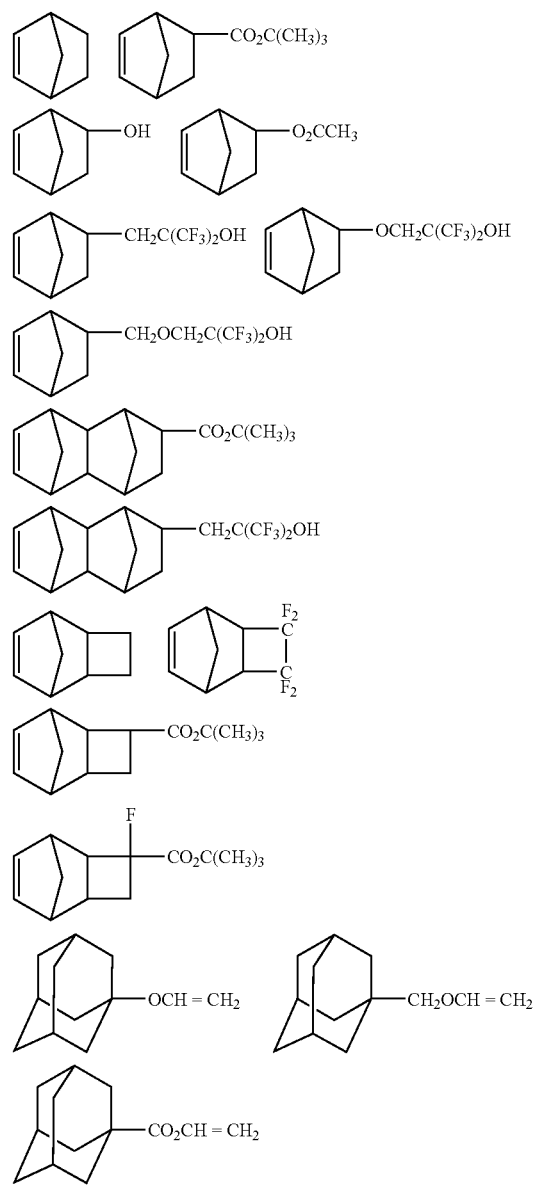

and c.) a repeat unit derived from an ethylenically unsaturated compound, which contains at least one fluorine atom covalently attached to an ethylenically unsaturated carbon atom.

29. A process for preparing a photoresist image on a substrate comprising, in order:

(W) coating a substrate with a photoresist composition, wherein the photoresist composition comprises:

a.) a polymer functionalized with at least one hydroxy ester functional group of the formula:

—$CO_2$—$C(Me)_2$-$(Me)_2$-OH, b.) at least one photoactive component; and c.) a solvent;

(X) drying the coated photoresist composition to substantially remove the solvent and thereby to form a photoresist layer on the substrate;

(Y) imagewise exposing the photoresist layer to form imaged and non-imaged areas; and (Z) developing the exposed photoresist layer having imaged and non-imaged areas to form the relief image on the substrate.

* * * * *